United States Patent [19]
Yoshida

[11] Patent Number: 5,608,324
[45] Date of Patent: Mar. 4, 1997

[54] APPARATUS FOR DETECTING A REMAINING CAPACITY OF A BATTERY IN A PORTABLE DATA TRANSMISSION/RECEPTION DEVICE

[75] Inventor: Toshio Yoshida, Tokyo, Japan

[73] Assignee: NEC Corporation, Tokyo, Japan

[21] Appl. No.: 365,937

[22] Filed: Dec. 29, 1994

[30] Foreign Application Priority Data

Dec. 29, 1993 [JP] Japan ................................. 5-352433

[51] Int. Cl.⁶ ................................................ G01N 27/416
[52] U.S. Cl. ............................ 324/426; 324/427; 324/433; 340/636; 320/48; 364/483
[58] Field of Search ........................... 324/426, 427, 324/428, 433, 434, 435; 340/636; 320/43, 44, 48; 364/481, 483, 550, 551.01, 707

[56] References Cited

U.S. PATENT DOCUMENTS

| | | | |
|---|---|---|---|
| 4,914,393 | 4/1990 | Yoshido | 340/636 X |
| 5,248,929 | 9/1993 | Burke | 320/48 |
| 5,321,392 | 6/1994 | Skakoon et al. | 340/636 |
| 5,365,221 | 11/1994 | Fennell et al. | 340/636 |
| 5,371,682 | 12/1994 | Levine et al. | 324/426 X |
| 5,424,722 | 6/1995 | Inada et al. | 324/426 X |
| 5,455,499 | 10/1995 | Uskali et al. | 320/43 |

FOREIGN PATENT DOCUMENTS

| | | |
|---|---|---|
| 0394074 | 10/1990 | European Pat. Off. . |
| 0611106 | 8/1994 | European Pat. Off. . |
| 0613203 | 8/1994 | European Pat. Off. . |
| 4-36817 | 2/1992 | Japan . |
| 2270983 | 3/1994 | United Kingdom . |

Primary Examiner—Maura K. Regan
Assistant Examiner—Diep Do
Attorney, Agent, or Firm—Sughrue, Mion, Zinn, Macpeak & Seas

[57] ABSTRACT

A controller of a card radio modem connectable to a data terminal measures two kinds of a battery voltage under a different load condition of the card radio modem. The controller determines the kind of battery and detects the remaining time of accuracy, based on the kind of the battery. In addition, the controller calculates an available capacity of a file data to be transmitted and received during the remaining time. When the available capacity is smaller than a capacity which is necessary to transmit and receive, the controller generates an alarm to inform an operator. The controller displays the available capacity or remaining time on a display.

17 Claims, 10 Drawing Sheets

APPARATUS FOR DETECTING A REMAINING CAPACITY OF A BATTERY IN A PORTABLE DATA TRANSMISSION/RECEPTION DEVICE

BACKGROUND OF THE INVENTION

1. Field of the Invention

The present invention relates to a power source device and, more particularly, to means for estimating the remaining electricity of a portable data modem powered by a battery, and the display of the efficient use of the battery.

2. Description of the Related Art

A power source device, which executes a power supply to a personal computer or similar electronic apparatus and informs the computer or apparatus of the consumption state of a battery, is described in, for example, Japanese Patent Laid-Open Application No. 36817/1992 (JP-A-04-36817). The power source device has a battery, a current sensor, a voltage sensor, and a capacity detector. The current sensor and voltage sensor measure the source current and source voltage of the battery, respectively. The capacity detector calculates a discharge energy by integrating the measured current and voltage by a time and estimates the remaining capacity of the battery.

The estimated remaining capacity is sent to the electric apparatus or computer to be supplied the power from the battery. In response, a controller installed in the electronic apparatus or computer makes the remaining capacity of the battery display.

In the conventional power source device described above, it is possible for a user to confirm the remaining capacity of the battery qualitatively. For instance, "60% remaining" is displayed. However, when it comes to the quantitative aspect, such a power source device cannot show specifically a period of time for which the battery is still usable, or how much capacity of a data signal can still be transmitted or received.

Moreover, in a data modem for a computer or similar device powered by one of a plurality of batteries, such as manganese battery or alkaline-manganese battery, each battery has a different discharge characteristic. Hence, the estimation of the remaining capacity involves noticeable errors and, therefore, do not withstand practical use.

SUMMARY OF THE INVENTION

It is therefore an object of the present invention to provide an apparatus or method for detecting a remaining capacity of a battery, capable of estimating a time for when the battery supplies a power.

Another object of the present invention is to provide an apparatus or method for a data modem capable of estimating a capacity of a data signal to be transmitted or received.

It is a further object of the present invention to provide an apparatus or method capable of estimating a remaining capacity of a battery even though a different kind of a battery is used.

It is still further object of the present invention to provide an apparatus or method capable of estimating the remaining electricity of a portable data modem powered by a battery.

The apparatus for detecting a remaining capacity of a battery according to the present invention is capable of measuring accurately the remaining time independent of a kind of the battery, and thereafter, calculating an available file capacity to transmit and receive during the remaining time. In addition, the apparatus displays the available file capacity and informs an operator when the available file capacity is smaller than a file which is necessary to be transmitted and received.

The apparatus measures two kinds of battery voltages under two kinds of load condition and determines a kind of the battery based on the measured battery voltages. The battery has different characteristics of voltages depending on an internal resistance therein. After determining the kind of the battery, the apparatus detects a remaining time of the battery.

In addition, the apparatus includes a radio section to transmit and receive a data signal. The apparatus calculates and displays an available file capacity to transmit and receive during the remaining time. When the available file capacity is smaller than a capacity in which the data signal is transmitted and received, the apparatus generates an alarm.

A signal processing system for detecting a remaining capacity of a battery, according to the present invention, includes means for identifying a kind of a battery, means for determining a remaining power of said battery based on said kind of said battery. The remaining power may be a remaining time. The apparatus displays the remaining time. In addition, the signal processing system includes means for transmitting and receiving a data signal. The apparatus determines an available data capacity of the data signal which is transmitted and received during the remaining time. The apparatus displays the available data capacity, and informs an operator when the available data capacity is smaller than a capacity which is necessary to transmit and receive a file.

BRIEF DESCRIPTION OF THE DRAWINGS

The above and other objects, features and advantages of this invention will become more apparent from the following detailed description taken with the accompanying drawings in which.

In the drawings, the same reference numerals denote the same structural elements.

DESCRIPTION OF THE PREFERRED EMBODIMENT

Figure 1:
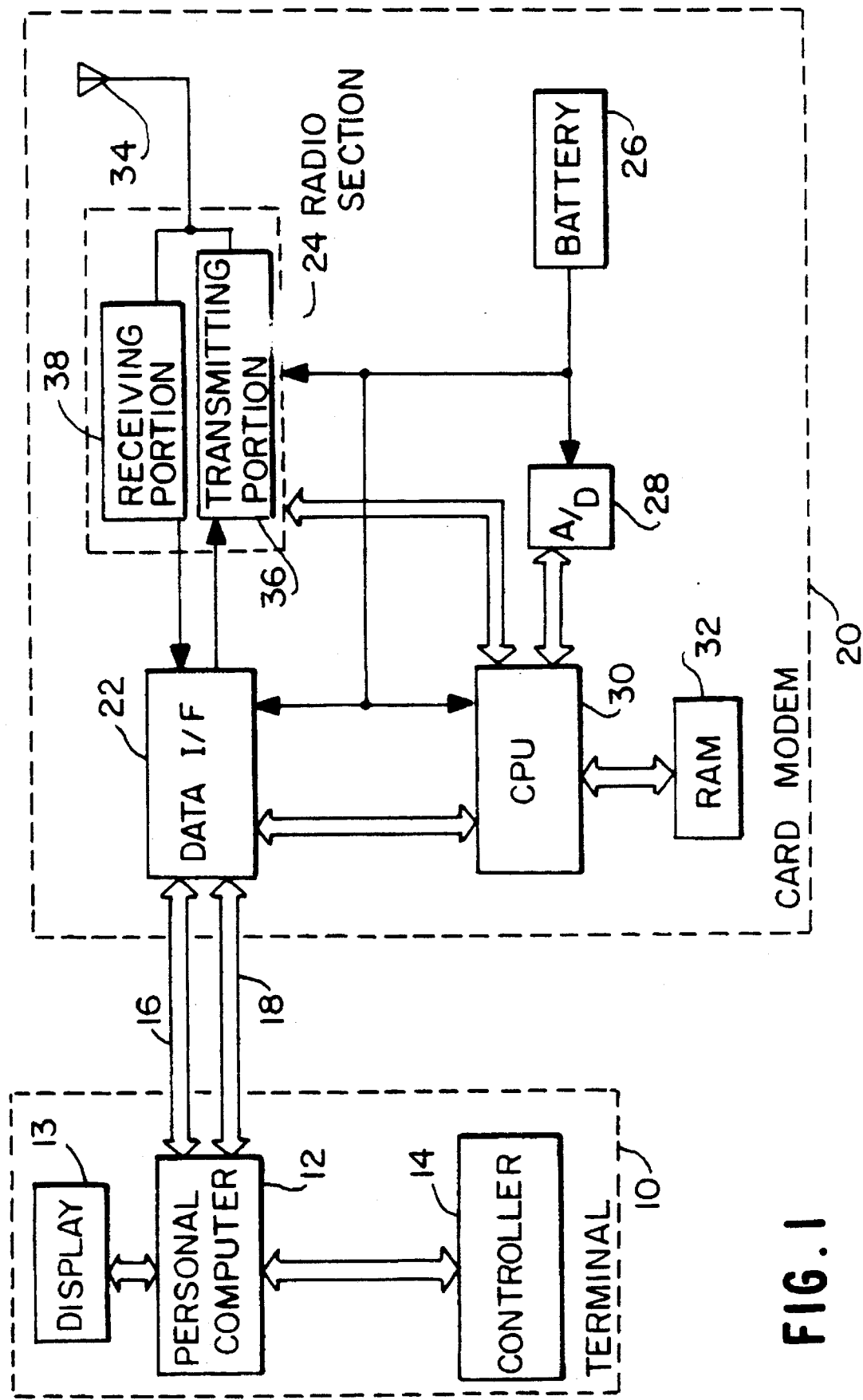
FIG. 1 is a block diagram of a preferred embodiment according to the present invention.

FIG. 1 is a block diagram of a preferred embodiment according to the present invention. A card modem 20 has a data interface (I/F) 22 for interchanging a data signal with a data terminal 10 including a personal computer 12 or a similar data terminal via a transmission/reception data bus 16 or an alarm (ARM) data bus 18. A radio section 24 includes a transmitting portion 36 and a receiving portion 38. The transmitting portion 36 modulates the data signal from the computer 12 via the data I/F 22 and transmits the modulated data signal to a remote radio station. The receiving portion 38 demodulates a data signal via an antenna 34 from the remote radio station. A battery 26 supplies power to the transmitting portion 36 and receiving portion 38 of the radio section 24, an analog-to-digital (A/D) converter 28, a central processing unit (CPU) 30, and the data I/F 22. The battery 26 supplies the power to the transmitting portion 36 when the data signal from the data terminal 10 is transmitted. The A/D converter 28 transforms the output voltage of the battery 26 to a digital voltage value. The CPU 30 calculates a remaining capacity of the battery 26 as described later, controls the operation of the radio section 24 by processing the digital voltage value from the A/D converter 4 as described later, and interchanges the data signal with a random access memory (RAM) 32 which is used to temporarily save the data signal therein.

The data terminal 10 is made up of the personal computer 12, a display 13, and a controller 14. The controller 14 sets a screen for displaying a data transmission/reception instruction information on the display 13, sets a data signal transmission/reception file, and executes the data signal transmission/reception.

Figure 2:
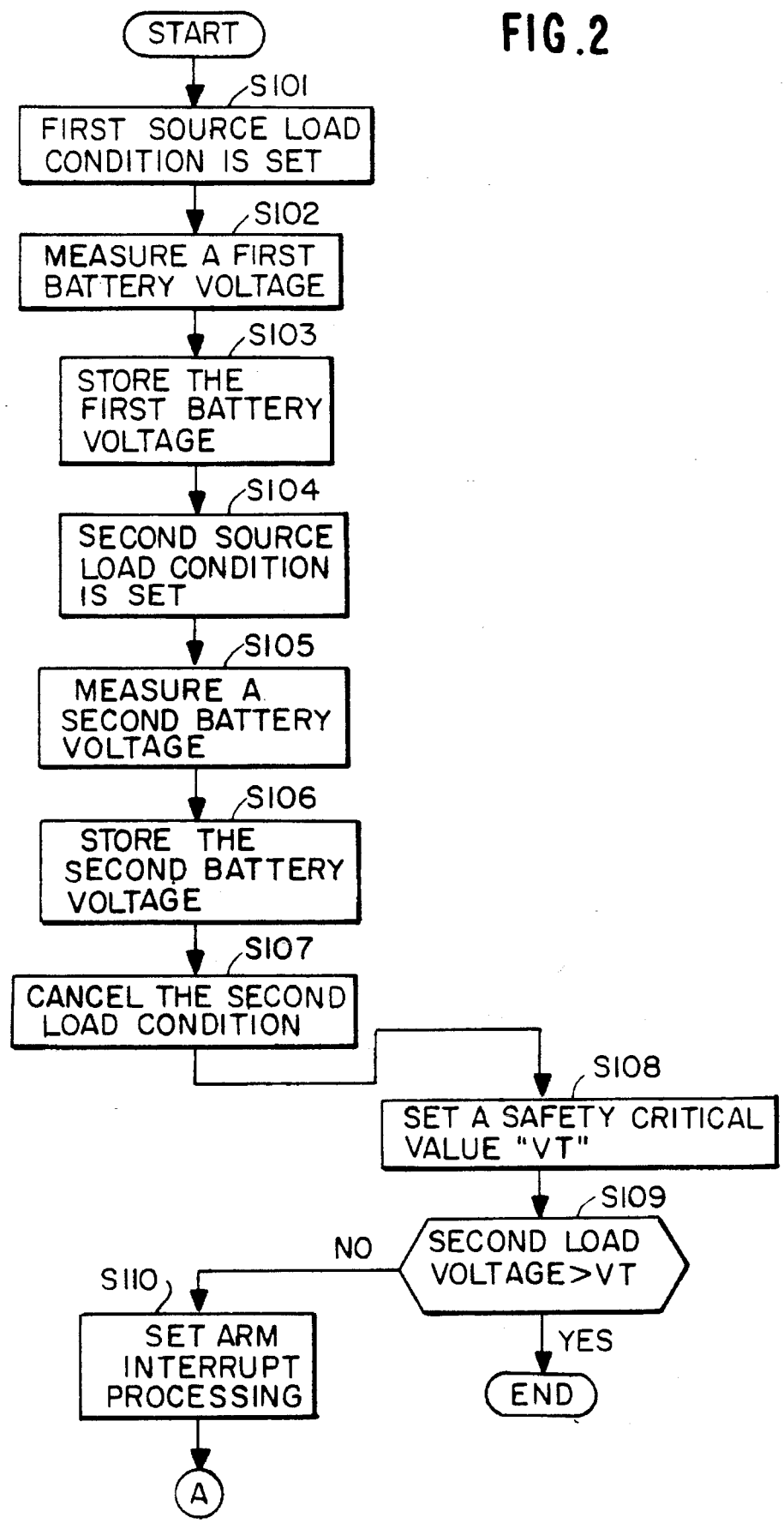
FIG. 2 is a flowchart demonstrating a procedure of measuring a battery voltage according to the present invention.

Preferred operations of the CPU 30 in the card modem 20 will be described in detail with reference to FIGS. 2–7. FIG. 2 is a flowchart demonstrating a procedure of measuring a battery voltage in the CPU 30.

To beginning with, a source load condition of the radio section 24 is set into a predetermined first source load condition (Step S101) in which, preferably, only the receiving portion 38 is switched on and the transmitting portion 36 is switched off. Namely, the transmitting portion 36 is not powered by the battery 26. Then, the CPU 30 measures a first source voltage of the battery 26 via the A/D converter 28 (Step S102) and stores a first digital value of the first source voltage into the RAM 32 (Step S103). Subsequently, the source load condition of the radio section 24 is set to a second source load condition in which, preferably, both of the transmitting portion 36 and receiving portion 38 are switched on (Step S104). The load under the second load condition is higher than that under the first source load condition. Then, the CPU 30 measures the source voltage of the battery 26 via the A/D converter 28 again (Step S105) and stores a second digital value of the source voltage into the RAM 32 (Step S106). Thereafter, the CPU 30 cancels the second load condition of the radio section 24 (Step S107) and sets a safety critical voltage VT of the remaining capacity of the battery 26 matching the first and second digital value (Step S108). The setting of the safety critical voltage VT will be described later. The CPU 30 compares the source voltage under the second load condition, as measured in step S105, with the safety critical voltage set in step S108 (step S109). If the source voltage under the second load condition is higher than the safety critical voltage, the procedure ends. If otherwise, the CPU 30 interrupts the processing under way and moves to an alarm (ARM) interrupt processing (Step S110) as described later.

In the above-described embodiment, although the source voltage under the second load condition is compared with the safety critical voltage VT, the source voltage under the first load condition may be compared with the safety critical voltage VT when only the receiving portion 38 is used.

Figure 3:
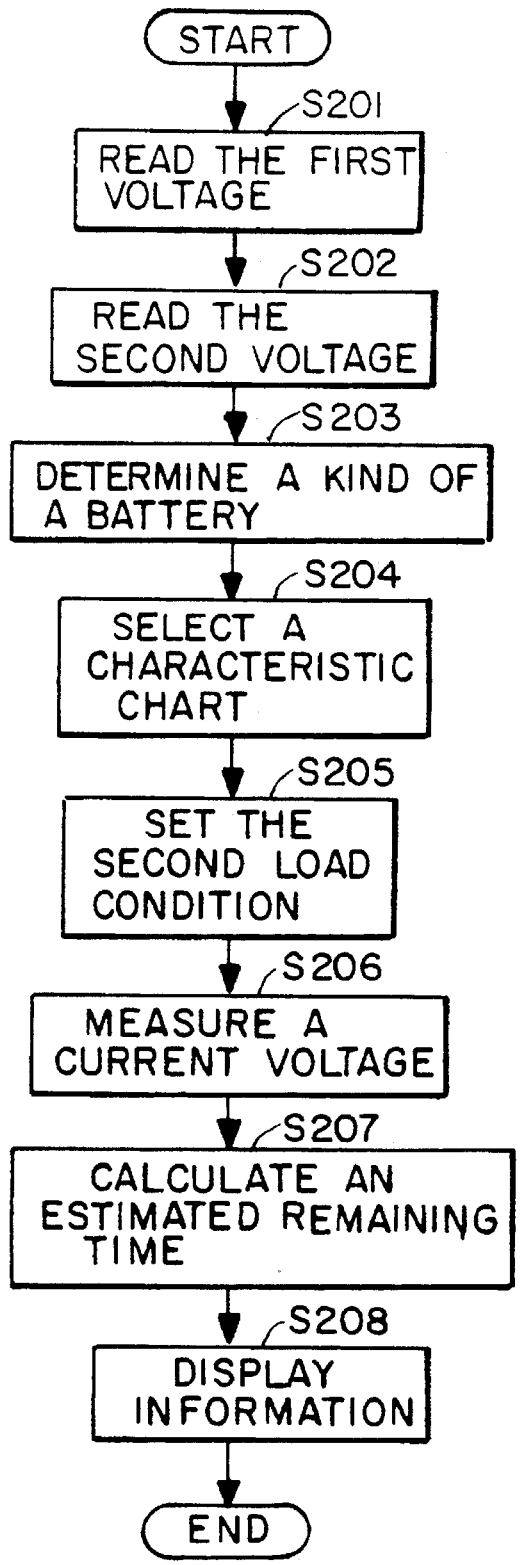
FIG. 3 is a flowchart representative of a procedure for calculating a remaining time on the basis of the voltage information.
Figure 4A:
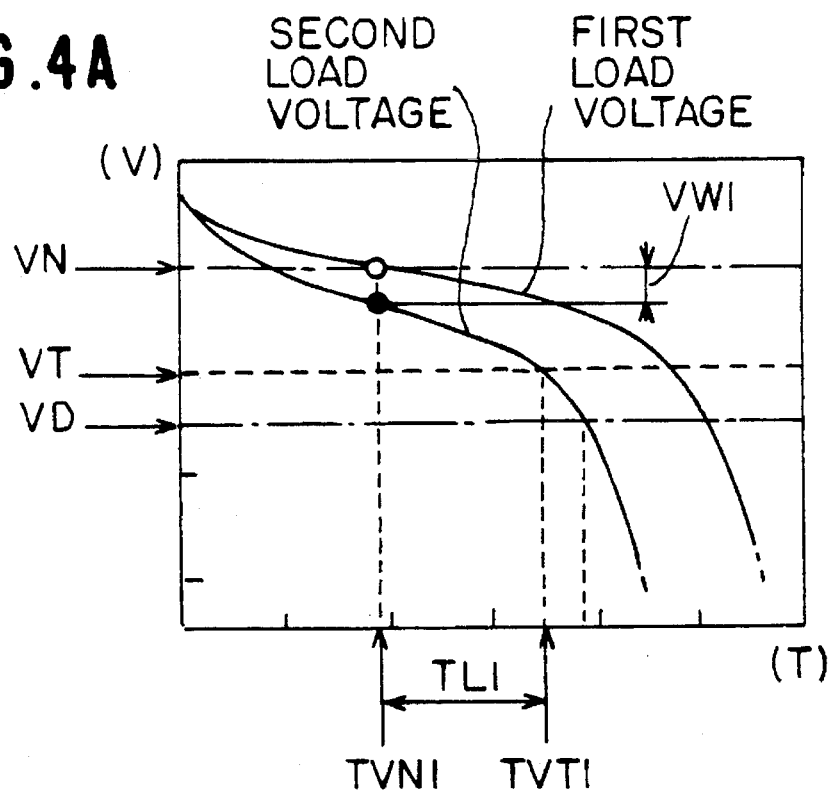
FIGS. 4(a) and 4(b) illustrate characteristic curves showing how the routine of the procedure showing in FIG. 3 determines the estimated remaining time more accurate.
Figure 4B:
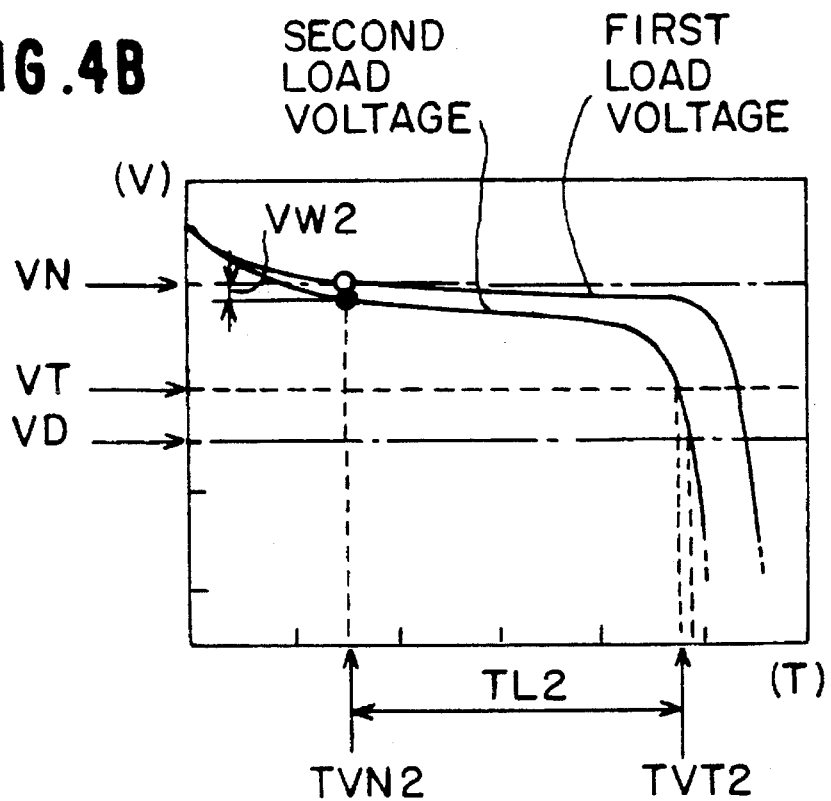

FIG. 3 is a flowchart representative of a procedure for calculating a remaining time on the basis of the voltage information produced by the above-identified measurement (FIG. 2). The CPU 30 reads the first digital value, or a first source load voltage, stored in the RAM 32 in step S103 of FIG. 2 (Step S201) and then reads the second digital value, or a second source load voltage, stored in the RAM 32 in step S105 of FIG. 2 (Step S202) as described below. Subsequently, the CPU 30 determines the kind of the battery on the basis of the first and second source load voltages, and the difference between the first and second source load voltages (Step S203). As shown in FIGS. 4(a) and 4(b), characteristic curves of each battery are different.

Next, the CPU 30 selects, among load characteristic charts stored in the RAM 32 beforehand, a chart matching the kind of the battery identified (Step S204). Further, the CPU 30 sets the radio section 24 into a designated condition, i.e., the first or second load condition, (Step. S205) and measures a current source voltage (Step S206). The CPU 30 calculates an estimated remaining time from the current source voltage to the safety critical voltage VT using characteristic curves of the selected characteristic chart (Step S207), and records the estimated remaining time into the RAM 32 or displays information, such as, the remaining time or capacity of a data file which the card modem can send or receive based on the remaining time (Step S208), and then ends the procedure.

In the above embodiment, in Steps S201 and S202, even though the first and second source load voltage stored in the RAM 32 are used, current first and second source load voltages may be measured under the first and second load condition, respectively. This results in deleting steps S205 and S206.

FIGS. 4(a) and 4(b) illustrate characteristic curves showing how the routine of the procedure showing in FIG. 3 determines the estimated remaining time more accurate. FIG. 4(a) indicates the load characteristic of a manganese battery or similar battery having a relatively higher internal resistance. FIG. 4(b) indicates the load characteristic of an alkaline-manganese battery or similar battery having a relatively lower internal resistance.

In FIGS. 4(a) and 4(b), VN indicates a reference battery voltage which the CPU 30 assumes temporarily. VT is the safety critical voltage of the source voltage which allows the card modem 20 to operate normally. VD is a voltage which, in effect, renders the card modem 20 unable to operate. VW1 and VW2 are each indicative of a difference between the first and second load voltages when the voltage under the first load condition is VN by way of example. TVN1 and TVN2 are each representative of a period of time, as estimated from a load characteristic chart, up to the time for VN to be reached under a load condition in which the first load voltage is assumed. TVT1 and TVT2 are each indicative of a period of time, as estimated from a load characteristic chart, up to the time for the second load voltage to reach the VT. Further, TL1 and TL2 are respectively indicative of the interval between TVN1 to TVT1 and the interval between TVN1 and TVT2. The TL1 and TL2 are corresponding to the remaining time.

In the above embodiment, since the second source load condition is a maximum load condition, a minimum time to reach at the safety critical voltage VT is set as the remaining time.

In step S203 in FIG. 3, the kind of the battery is determined on the basis of the voltage difference attributable to a change in the two load condition, as represented by VW1 or VW2, relative to the absolute value of the first load voltage.

To estimate a remaining time in step S207, the CPU 30 reads the approximate values of the characteristics curves of the first and second loads in FIG. 4(a) or 4(b), out of the RAM 32, and determines TVN1 or TVN2 from the current load voltage. Thereafter, the CPU 30 calculates a difference TL1 or TL2 between TVN1 and TVT1 or TVN2 and TVT2 which is read from the approximate values of the characteristic curves, and uses the difference TL1 or TL2 as an estimated remaining time. In step S207, when the designated condition is the first load condition, the remaining time may be the time from the current load voltage to the safety critical voltage VT under the first load condition.

In step S108 in FIG. 2, the safety critical voltage VT is set after the determination of the characteristic chart and curves in steps S202 to S206.

As shown in FIG. 2, if the source voltage under the second load condition is not higher than the safety critical voltage, the ARM interrupt processing starts. However, the first source voltage may be compared with the safety critical voltage when the first load condition is designated.

Figure 5:
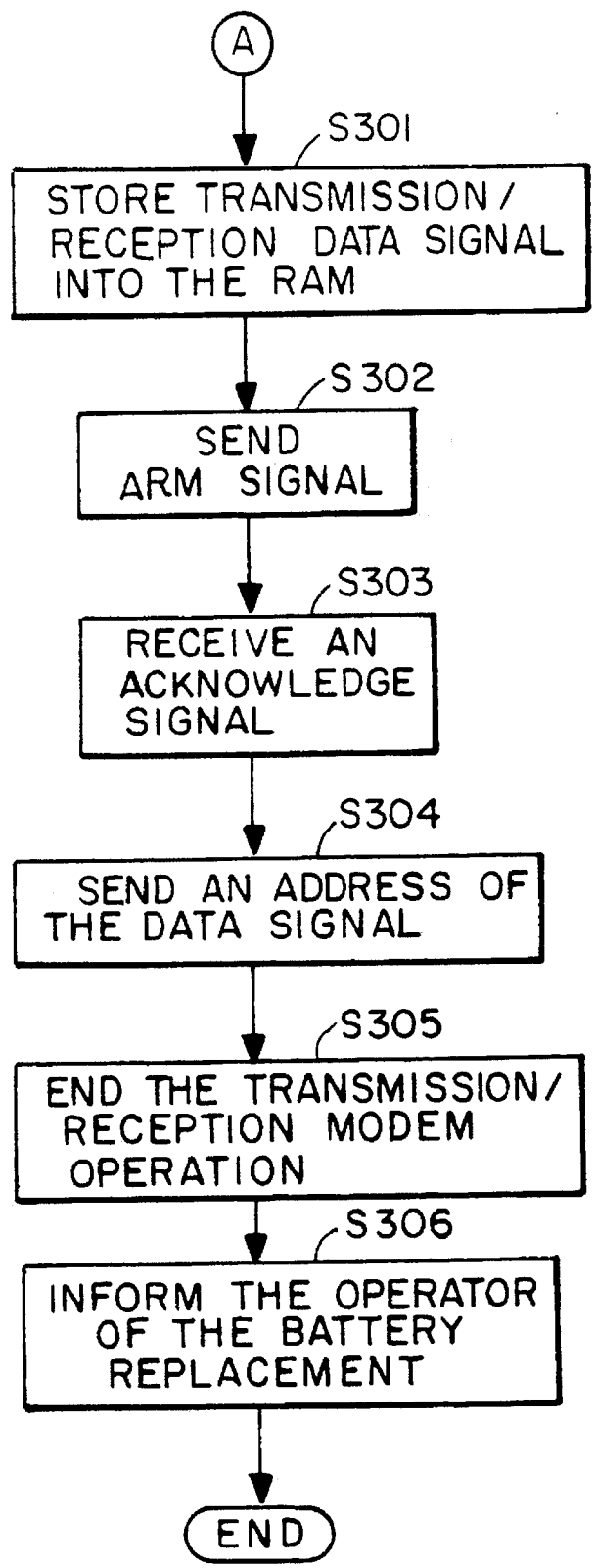
FIG. 5 is a flowchart representative of a procedure in the ARM interrupt processing which indicates that the battery voltage has fallen below the safety critical value.

FIG. 5 is a flowchart representative of a procedure in the ARM interrupt processing which indicates that the battery voltage has fallen below the safety critical value. Assume that the ARM interrupt processing is requested in step S110 in FIG. 2. Then, the CPU 30 interrupts the procedure under way and saves the data signal in transmission/reception in the RAM 32 (Step S301). Subsequently, the CPU 30 sends the ARM signal to the remote radio station (not shown) and the controller 14 (Step S302). On receiving an acknowledge signal from both of the controller 14 and the remote station (Step S303), the CPU 30 sends to the controller 14 and the remote station the address of the data signal at which the data transmission/reception has been interrupted (Step S304). The CPU 30 ends the transmission/reception modem operation (Step S305) and causes the card modem 20 itself to flash an indicator, produce an alarm tone, or otherwise urges the operator to replace the battery (Step S306).

Figure 6:
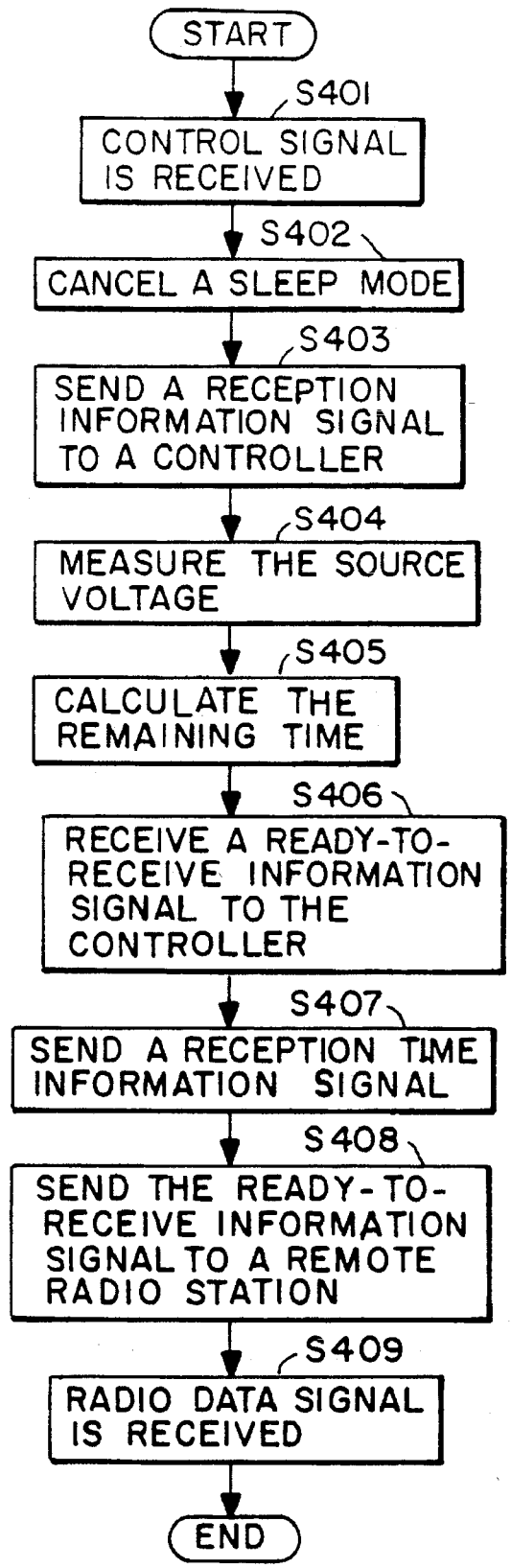
FIG. 6 is representative of a routine in which the CPU hands over a received radio data signal to the personal computer or similar data terminal.

FIG. 6 is representative of a routine in which the CPU 30 hands over a received radio data signal to the personal computer or similar data terminal 10. When a control signal comes in through the antenna 34 to the radio section 24 (Step S401), the control signal reception is reported to the CPU 30. In response, the CPU 30 cancels a sleep mode which has been set up for saving the power of the entire card modem 20 (Step S402). In addition, the CPU 30 sends a reception information signal to the controller 14 via the data I/F 22 (Step S403) and reads the output digital signal of the A/D converter 28, i.e., measures the source voltage (Step S404). Based on the result of measurement, the CPU 30 determines the kind of the battery and calculates the remaining time estimated under the designated load condition as described before (Step S405). The received control signal includes a signal indicating the designated load condition. On receiving a ready-to-receive information signal from the controller 14 (Step S406), the CPU 30 sends the estimated remaining time to the controller 14 as a reception time information signal (Step S407) and then sends the ready-to-receive information signal to the remote radio station (Step S408). When a radio data signal is received via the antenna 34 (Step S409), the CPU 30 executes a received data signal modem processing immediately for handing over the received data signal to the personal computer 12.

Figure 7:
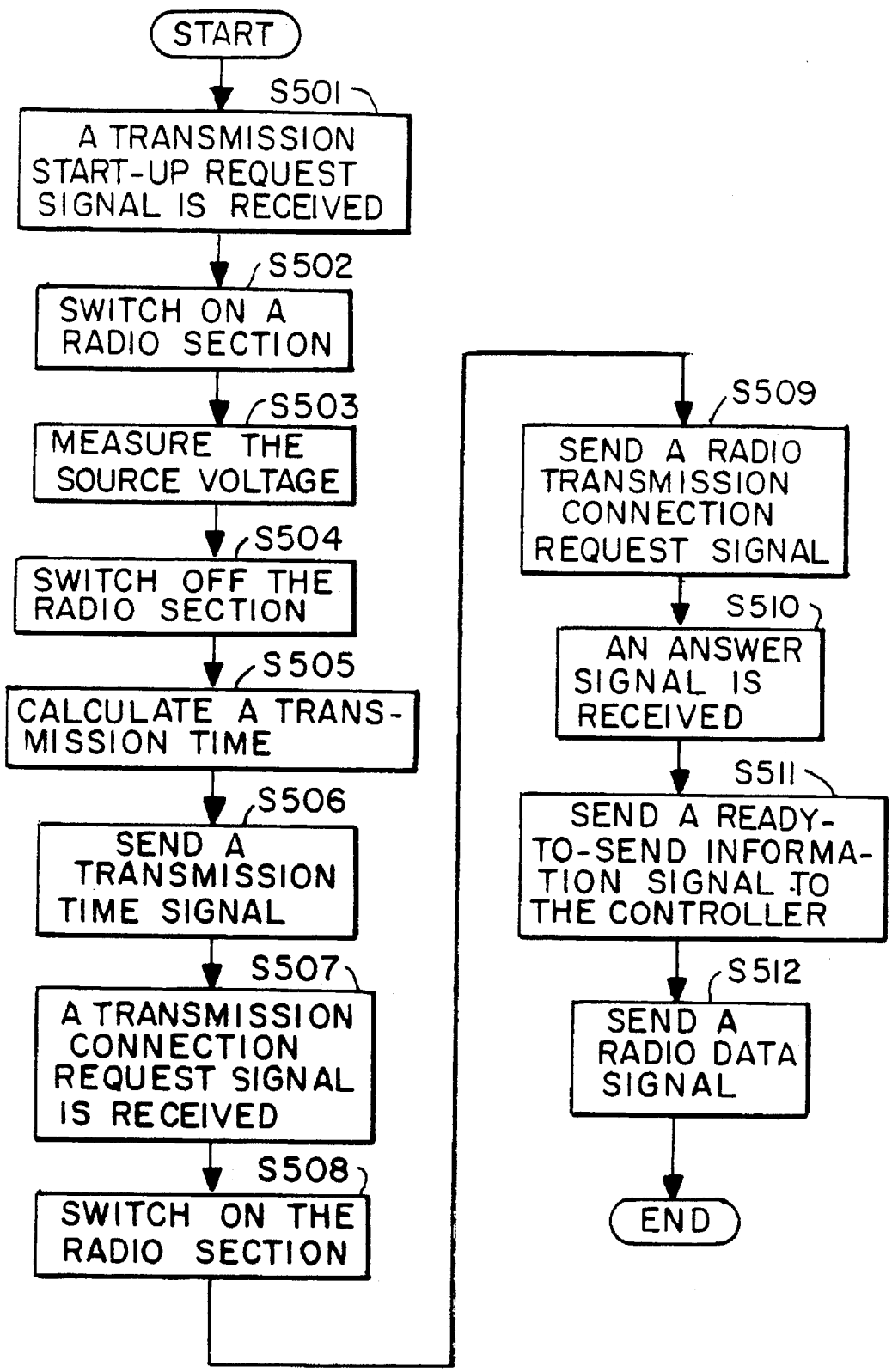
FIG. 7 is a flowchart demonstrating a procedure in which a data signal from the data terminal is sent in the form of a radio data signal.

FIG. 7 is a flowchart demonstrating a procedure in which a data signal from the data terminal is sent in the form of a radio data signal. When a transmission start-up request signal is received from the controller 14 through the computer 12 and the data I/F 22 (Step S501), the CPU 30 switches on the radio section 24 (Step S502). Then, the CPU 30 reads the output digital signal of the A/D converter 28 in order to measure the source voltage (Step S503) and once switches off the radio section in order to save a battery power (Step S504). Subsequently, the CPU 30 determines the kind of the battery on the basis of the operation in step S503, selects a load characteristic chart, and calculates a remaining time estimated under the designated load condition as described before (Step S505). The CPU 30 sends the remaining time to the controller 14 as a transmission time signal indicating how long the modem needs to send a data file (Step S506). On receiving a transmission connection request signal from the controller (Step S507), the CPU 30 switches on the radio section 24 again (Step S508) and the CPU 30 transforms the request signal to a radio data signal and sends the radio data signal via the antenna 34 as a radio transmission connection request signal (Step S509). When an answer signal from the remote radio station is received (Step S510), the CPU 30 delivers a ready-to-send information signal to the controller 14 (Step S511). On receiving a data signal to be transmitted from the controller 14, the CPU 30 executes transmission modem processing immediately for converting the data signal to a radio data signal and sending the radio data signal via the antenna 34 (Step S512).

Next, preferred operations of the controller will be described with reference to FIGS. 8 to 10.

Figure 8:
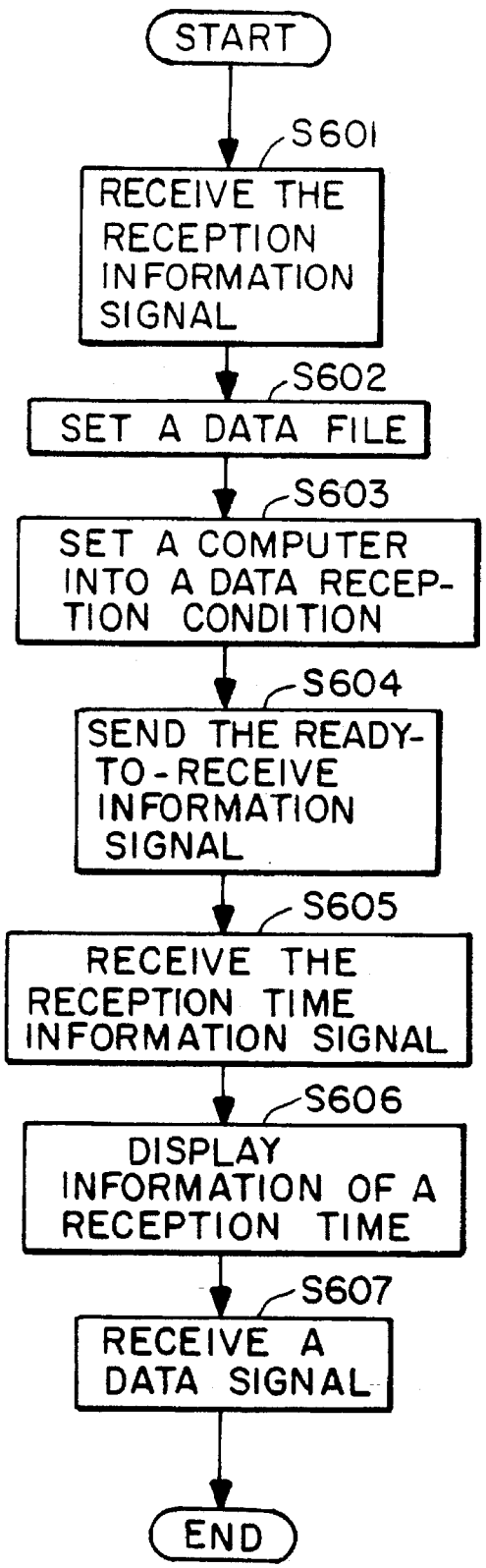
FIG. 8 is a flowchart demonstrating a procedure in which the controller deals with a data signal received from the card modem.

FIG. 8 is a flowchart demonstrating a procedure in which the controller 14 deals with a data signal received from the card modem 20. The controller 14 receives the reception information signal of a remote station from the card modem 20 via the data I/F 22 (Step S601). In response, the controller 14 sets a data file for a reception and recording (Step S602) and then sets the computer 12 into a data reception condition based on a setting signal including in the reception information signal (Step S603). Subsequently, the controller 14 sends to the card modem 20 the ready-to-receive information signal indicating that it is ready to receive a data signal (Step S604). Next, the controller 14 receives the reception time information signal counted and calculated by the CPU 30 (Step S605). Thereafter, the controller 14 informs a user of receiving the control signal and the content of the reception time on the screen (Step S606). As soon as the data terminal 10 receives a data signal from the card modem 20 via the data I/F 22, the controller 14 processes the data signal (Step S607). The CPU 30 may send the reception time to the remote station.

Figure 9:
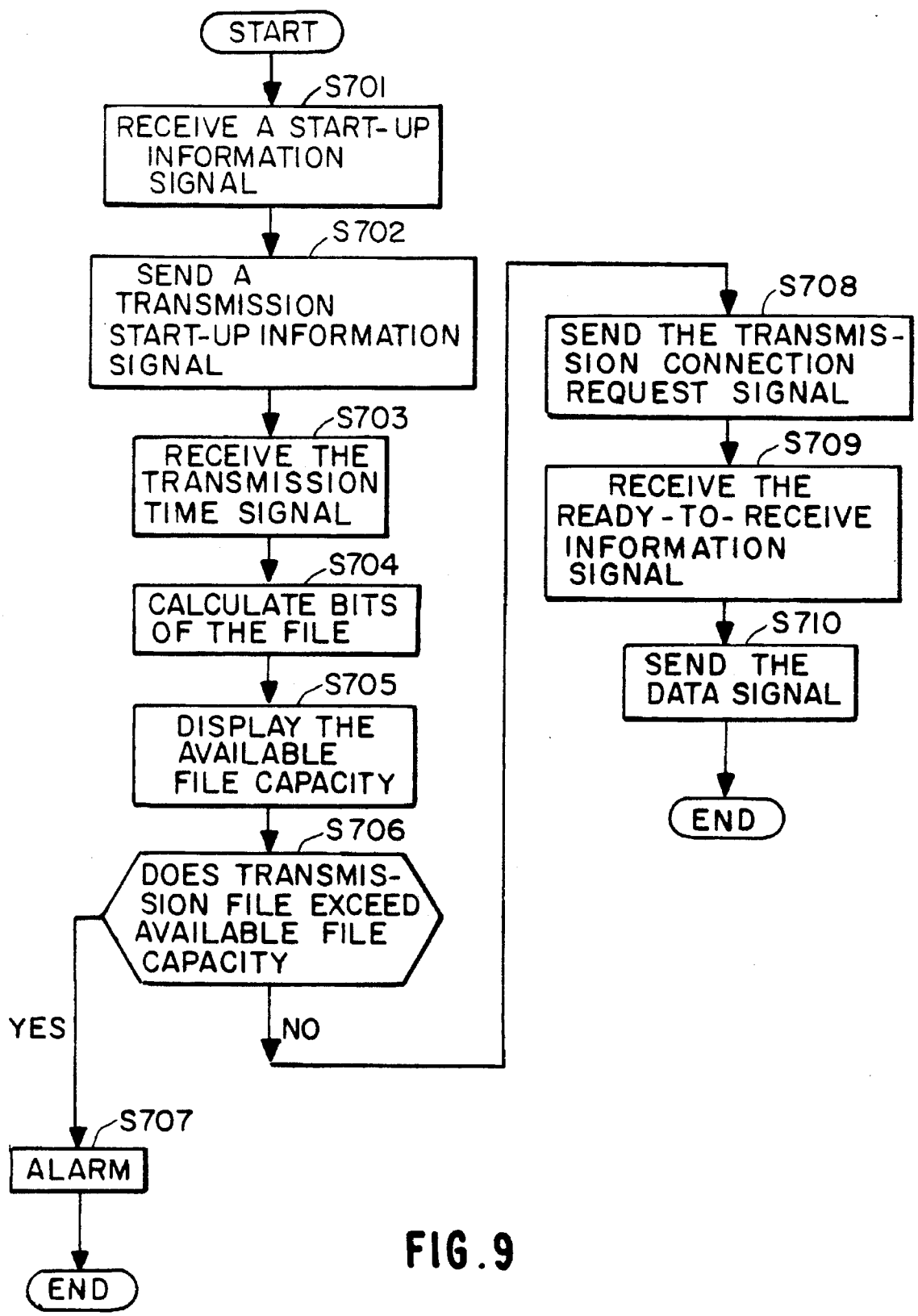
FIG. 9 is a flowchart demonstrating a procedure which the controller executes for sending a data signal from the data terminal to the card modem.
Figure 10:
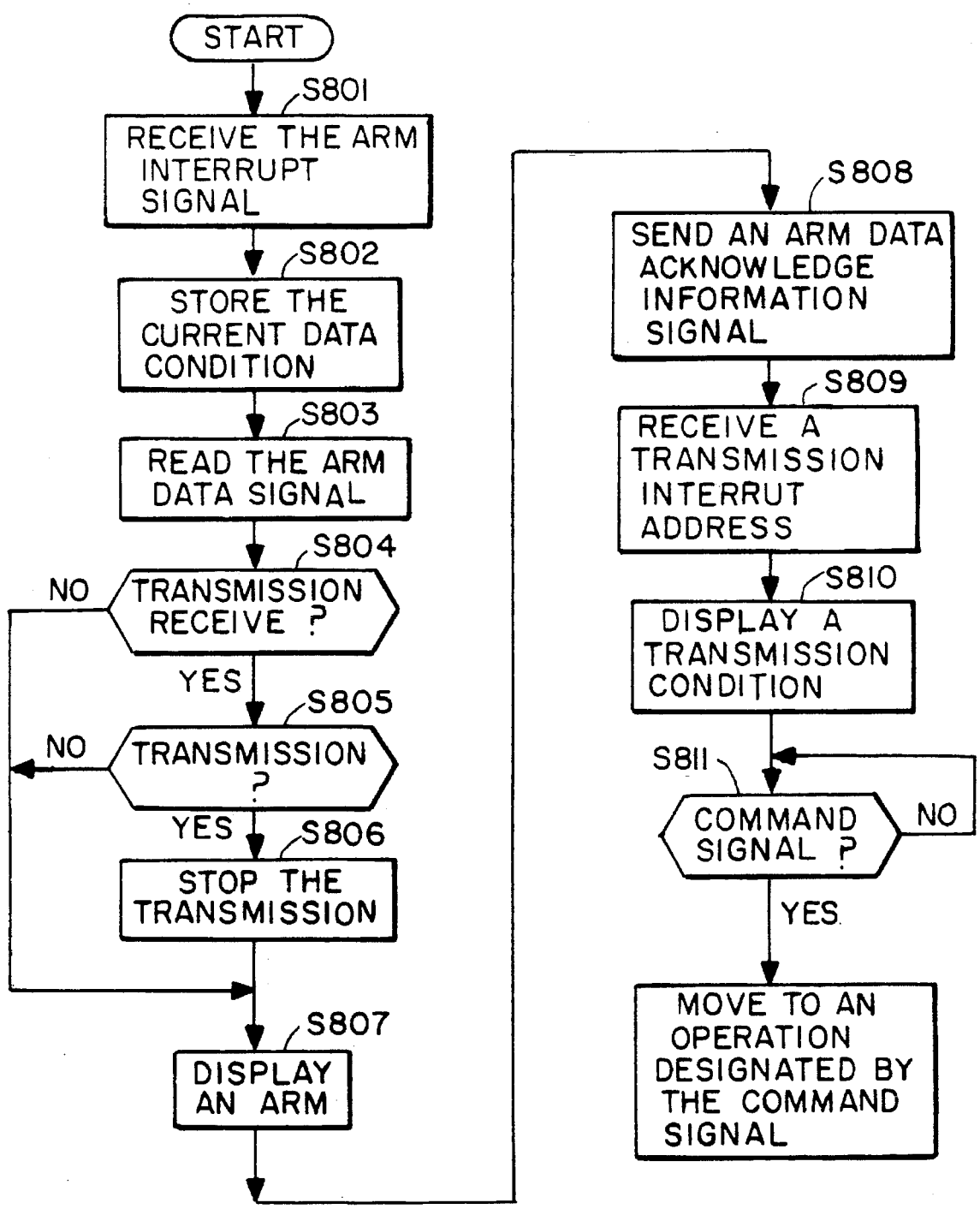
FIG. 10 is a flowchart demonstrating a procedure which the controller executes an ARM interrupt routine.

FIG. 9 is a flowchart demonstrating a procedure which the controller 14 executes for sending a data signal from the data terminal 10 to the card modem 20. On receiving a transmission start-up information signal keyed in on, for example, a personal computer (Step S701), the controller 14 sends the transmission start-up request signal to the CPU 30 of the card modem 20 via the data I/F 22 (Step S702). Subsequently, the controller 14 receives the transmission time signal from the CPU 30 (Step S703) and calculates the number of bits of a file which can be sent to the card modem 20 (Step S704). Then, the controller 14 displays the available file capacity on a screen assigned to a transmission file (Step S705). If the transmission file set by the operator exceeds the available file capacity (Step S706), the controller 14 produces an alarm to urge the operator to reduce the file or to replace the battery (Step S707). Otherwise, the controller 14 sends the transmission connection request signal to the card modem 20 (Step S708). On receiving the ready-to-receive information signal from the card modem 20 (Step S709), the controller 14 starts a data transmission processing immediately (Step S710).

Assume that the controller 14 has received from the card modem 20 an alarm data signal or ARM interrupt signal, indicating that the remaining capacity of the battery is short of a safety level. Then, the controller 14 executes an ARM interrupt routine shown in FIG. 10. On receiving the ARM interrupt signal (Step S801), the controller 14 interrupts a routine under way and saves the current data transmission/reception conditions in the RAM 32 (Step S802). Subsequently, the controller 14 reads the ARM data signal (Step S803), determines whether or not the data transmission/reception has been under way up to that time (Step S804), and determines whether or not the data transmission has been under way (Step S805). Only if the data transmission has been under way as determined in the step S805, the controller 14 stops the transmission (Step S806). The controller 14 sets a suitable ARM message signal, e.g., "Stop modem" or "Change battery" as a content to be displayed on the personal computer (Step S807), and sends an ARM data acknowledge information signal to the card modem 20 (Step S808). When the controller 14 receives a transmission interrupt address from the card modem 20 (Step S809), it displays a file name sent, destination, transmission interrupt address and other transmission interrupt conditions (Step S810) and awaits the next command to be entered by the operator (Step S811). The measuring operation of the remaining capacity may be executed not only in response to the transmission start-up request signal or the control signal from the remote station but also periodically.

As hitherto described, according to the present invention, since the apparatus for estimation a remaining time disclosed herein measures a battery voltage under at least two load conditions and estimates the kind of a battery, the apparatus permits accurately measuring of remaining time based on the kind of the battery. Moreover, the apparatus permits informing the operator of how long the data terminal can be operated or how much file capacity can be transmitted and received with the data modem.

While the invention has been described with reference to specific embodiments thereof, it will be appreciated by those skilled in the art that numerous variations, modifications, and embodiments are possible, and accordingly, all such variations, modifications, and embodiments are to be regarded as being within the spirit and scope of the invention.

What is claimed is:

1. A signal processing system for detecting a remaining capacity of a battery, comprising:

measuring means for measuring a battery voltage;

first detecting means for detecting a first time for said battery voltage to reach a predetermined level based on a pre-stored battery characteristic curve;

second detecting means for detecting a second time for said battery voltage to reach a predetermined threshold voltage based on said pre-stored battery characteristic curve;

estimating means for estimating a remaining time of a battery life of said battery based on said first time and said second time.

2. The system as claimed in claim 1, further comprising:

means for informing a user that said remaining time is shorter than a predetermined time.

3. The system as claimed in claim 1, further comprising:

means for displaying said remaining time.

4. The system as claimed in claim 1, wherein said pre-stored battery characteristic curve indicates a characteristic of the battery under a condition where a maximum load is applied to said battery and said remaining time indicates a minimum time of said battery life.

5. A signal processing system having a radio modem connectable to a data terminal, said radio modem comprising:

a radio section for transmitting a transmission data signal from said data terminal to a remote radio station and for receiving a reception data signal from said remote radio station;

a battery for supplying a battery voltage to said radio section; and a first controller for measuring a battery voltage, detecting a first time for said battery voltage to reach a predetermined level based on a pre-stored battery characteristic curve, detecting a second time for said battery voltage to reach a predetermined threshold voltage based on said pre-stored battery characteristic curve, estimating a remaining time of a battery life of said battery based on said first time and said second time, and determining a data capacity of said data signal which is transmitted and received.

6. The system as claimed in claim 5, further comprising:

means for displaying an available data capacity.

7. The system as claimed in claim 6, further comprising:

means for informing an operator that said available data capacity is less than said data capacity of said data signal which is transmitted and received.

8. The system as claimed in claim 5, said further comprising:

means for detecting an available file capacity of said data signal transmitted and received during said remaining time based on said remaining time.

9. The signal processing system as claimed in claim 5, wherein said data terminal comprises:

a display for displaying said remaining power; and a second controller for calculating an available file capacity of said data signal transmitted and received during said remaining time and for displaying said available file capacity as said remaining power on said display.

10. The signal processing system as claimed in claim 9, said data terminal further comprising:

means for informing an operator that said available file capacity is less than a data capacity which is to be transmitted and received.

11. A method for detecting a remaining capacity of a battery, the method comprising the steps of:

measuring first and second battery voltages of said battery when the battery is under at least two load conditions respectively;

identifying a kind of said battery based on a comparison of said first and second battery voltages;

determining said remaining capacity by measuring a battery voltage, detecting a first time for said battery voltage to reach a predetermined level based on a pre-stored characteristic curve for said kind of said battery, detecting a second time for said battery voltage to reach a predetermined threshold voltage based on said characteristic curve; and calculating a remaining time of said battery based on said remaining capacity.

12. The method for detecting as claimed in claim 11, the method further comprising the step of:

displaying said remaining time.

13. The method for detecting as claimed in claim 11, the method further comprising the step of:

informing an operator that said remaining time is shorter than a predetermined time.

14. A method for controlling a detection of a remaining power of a battery, said battery supplying a battery power to a radio modem connectable to a data terminal, said radio modem transmitting and receiving a data signal, the method comprising the steps of:

setting said radio modem into first and second load conditions;

measuring first and second battery voltages of said battery when the battery is under said first and second load conditions respectively;

identifying a kind of said battery based on a comparison of said first and second battery voltages;

determining a remaining capacity by measuring a battery voltage, detecting a first time for said battery voltage to reach a predetermined level based on a pre-stored characteristic curve for said kind of said battery, detecting a second time for said battery voltage to reach a predetermined threshold voltage based on said characteristic curve; and calculating a remaining time of said battery based on said remaining capacity.

15. The method for controlling as claimed in claim 14, the method further comprising the steps of:

detecting an available file capacity of said data signal transmitted and received during said remaining time.

16. The method for controlling as claimed in claim 15, the method further comprising the step of:

displaying said available file capacity.

17. The method for controlling as claimed in claim 15, the method further comprising the step of:

informing an operator that said available file capacity is less than a file capacity which is to be transmitted and received.

* * * * *